United States Patent [19]

Igarashi et al.

[11] Patent Number: 5,692,293
[45] Date of Patent: Dec. 2, 1997

[54] AUTOMATIC ELECTRONIC PART-MOUNTING APPARATUS

[75] Inventors: Tsuneto Igarashi, Kadoma; Shigetoshi Negishi, Suita; Kunio Tanaka, Kadoma; Masahiro Morimoto, Hirakata; Kazuaki Kosaka; Yoshifumi Hirata, both of Neyagawa, all of Japan

[73] Assignee: Matsushita Electric Industrial Co., Ltd., Osaka, Japan

[21] Appl. No.: 659,347

[22] Filed: Jun. 6, 1996

[30] Foreign Application Priority Data

Jun. 14, 1995 [JP] Japan .................. 7-147187

[51] Int. Cl.$^6$ .......................... H05K 3/30; H05K 13/02; H05K 13/04; B23P 19/04
[52] U.S. Cl. .................. 29/740; 29/741; 29/743; 29/DIG. 44; 294/64.1; 414/226; 414/737; 414/744.3; 414/752
[58] Field of Search .............. 29/739-743, DIG. 44; 62/431, 438; 294/2, 64.1; 165/61; 414/226, 737, 744.3, 752; 279/3

[56] References Cited

U.S. PATENT DOCUMENTS

| 4,515,507 | 5/1985 | Asai et al. ................. 44/226 |
| 4,787,137 | 11/1988 | Jeanmairet et al. ............ 29/740 |
| 4,858,308 | 8/1989 | Komori ...................... 29/741 X |
| 4,951,388 | 8/1990 | Eguchi et al. ................ 29/743 X |
| 5,033,185 | 7/1991 | Hidese ....................... 29/740 |
| 5,228,732 | 7/1993 | Rarscher .................... 294/64.1 X |
| 5,402,564 | 4/1995 | Tsukasaki ................... 29/739 X |
| 5,457,874 | 10/1995 | Yonezawa et al. ............. 29/741 X |
| 5,544,411 | 8/1996 | Kano et al. .................. 29/740 |
| 5,579,572 | 12/1996 | Kashiwagi et al. ........... 414/752 X |
| 5,588,195 | 12/1996 | Asai et al. .................. 29/742 X |

FOREIGN PATENT DOCUMENTS

| 0424641 | 5/1991 | European Pat. Off. . | |
| 1297898 | 11/1989 | Japan ....................... | 29/743 |
| 2180100 | 7/1990 | Japan ....................... | 29/740 |
| 4162499 | 6/1992 | Japan ....................... | 29/743 |

Primary Examiner—Peter Vo

[57] ABSTRACT

There is disclosed an automatic electronic part-mounting apparatus in which acceleration, acting on electronic parts, suction-held respectively by mounting heads, is reduced, thereby enabling stable mounting of the electronic parts. Cam levers 10 are pivotally mounted through respective pivot shafts 9 on a rotary member 8 which is rotated at a constant speed by a roller gear cam 19. One end of the cam lever is engaged with a fixed cam 7 whereas the other end thereof is slidably mounted through cam followers on a follower lever 12 slidably mounted on annular rails 11 in a housing 6. One end of the follower lever 12 is slidably engaged with a cam follower, and the other end of the follower lever 12 is mounted on each mounting head 13. With this construction, the acceleration of the mounting head 13 can be reduced.

4 Claims, 14 Drawing Sheets

FIG. 9A
FIG. 9B
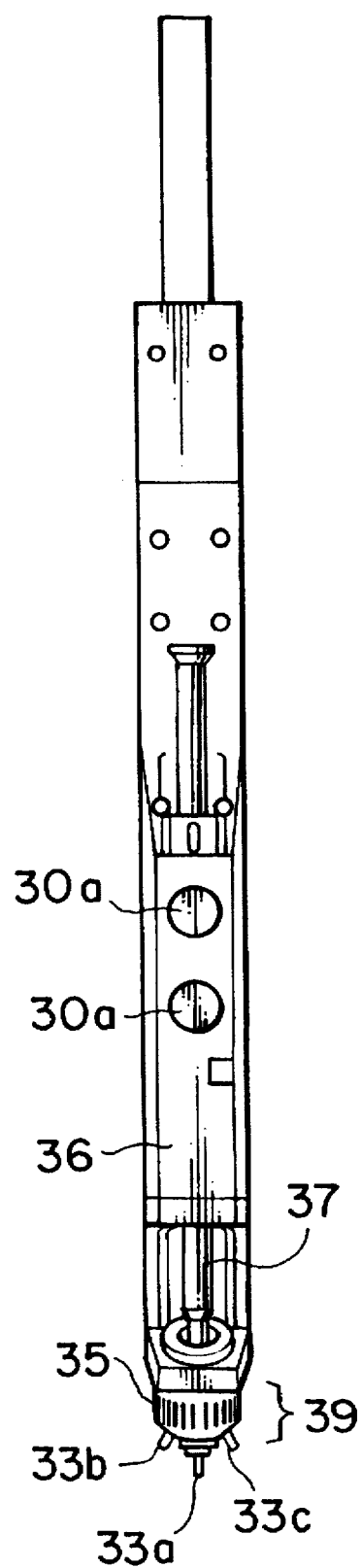
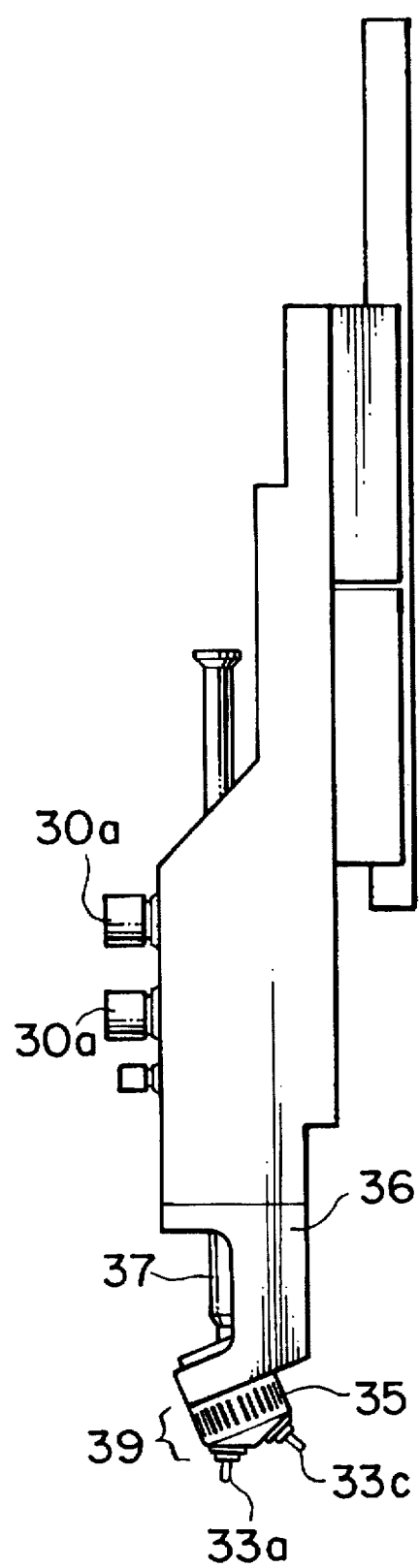

AUTOMATIC ELECTRONIC PART-MOUNTING APPARATUS

BACKGROUND OF THE INVENTION

This invention relates to an automatic electronic part-mounting apparatus used for mounting chip-type electronic parts on a circuit board forming a circuit in electronic equipment.

Conventionally, electronic parts 50, such as those 50a to 50d shown in FIG. 11, are packaged using a mount 52 (having a series of storage recesses 51 spaced from one another at equal intervals) and an adhesive tape 53 in such a manner that the electronic parts 50 are received respectively in the storage recesses 51, and the mount 52, holding the electronic parts 50, is wound, together with the adhesive tape 53, on a reel 54. The electronic parts 50, thus packaged in the form of a tape, have been supplied to the user. An automatic electronic part-mounting apparatus of the rotary head type has been marketed for mounting the electronic parts 50, thus packaged in a tape form, on a circuit board 1 (see FIG. 13) at high speed, and this apparatus is schematically shown in FIG. 13 (cross-sectional view) and FIG. 14 (plan view).

This automatic electronic part-mounting apparatus of the rotary head type comprises an X-Y table 2 for positioning and holding the circuit board 1 on which the electronic parts 50 are to be mounted, a plurality of part supply shelves 3 (which are movable in a direction Z (FIG. 14)) each for supplying the tape-like packaged electronic parts 50 one by one in accordance with an instruction, and mounting heads 56 provided between the X-Y table 2 and the part supply shelves 3. Each of the mounting heads 56 holds the electronic part 50, supplied from the part supply shelf 3, by suction at a suction station 55a, and also effects predetermined operations at the other stations 55b to 55h including the positioning station 55c, the mounting station 55e and the suction nozzle selection station 55g.

FIG. 15 shows the construction of the mounting head 56. A plurality of suction nozzles 57a to 57e are arranged circumferentially on a rotary table 58, and the rotary table 58 is rotated so as to select one of the suction nozzles 57a to 57e corresponding in size to the electronic parts to be mounted (FIG. 15 shows a condition in which the suction nozzle 57a is selected). An opening-closing valve 60 for supplying vacuum to the selected suction nozzle 57a is mounted on the mounting head 56.

As shown in FIG. 16, other suction nozzles 57b to 57e than the selected suction nozzle 57a are held respectively by pawls 59 so that they will not interfere with electronic parts 66 on the circuit board 1 when the electronic parts 50 are to be mounted on the circuit board 1 (h1>h2), and only the selected suction nozzle 57a is projected.

The operation of the automatic electronic part-mounting apparatus of this construction will now be described with reference to FIGS. 13 and 14.

The plurality of mounting heads 56 are arranged at equal intervals on an outer periphery of a turntable 63 connected to an output shaft 62 of an index drive 61 which effects intermittent rotary indexing. The stations 55a to 55h (the suction station 55a, the positioning station 55c, the mounting station 55e, the suction nozzle selection station 55g and etc.) for effecting the respective operations are located in a circular path of travel of the mounting heads 56. As shown in FIG. 17, the index drive 61 determines stop times t1 and indexing times t2 so that the turntable 63 can be repeatedly stopped and indexed, and each mounting head 56 is stopped sequentially at the operating stations, thereby effecting the predetermined operations.

In accordance with the rotation of the turntable 63, the mounting head 56 is moved upward and downward, and is rotated under the control of a fixed cylindrical cam 64 and a LM guide 65, and more specifically the mounting head 65 moves downward at the suction station 55a to receive the electronic part 50, and is further transferred to the positioning station 55c in accordance with the rotation of the turntable 63, thereby positioning the electronic part 50. After this positioning is completed, the mounting head 56 is transferred to the mounting station 55e, and moves downward there, thereby mounting the electronic part 50 on the circuit board 1 positioned by the X-Y table 2.

Thereafter, at the suction nozzle selection station 55g, the rotary table 58 is rotated so as to select one of the suction nozzles 57a to 57e (see FIGS. 15 and 16) corresponding to the electronic part 50 to be subsequently picked up by suction from the part supply shelf 3, and the pawl 68 is disengaged from the thus selected suction nozzle 57a, and the suction nozzle 57a is projected downward. Also, the precedingly-selected, projected suction nozzle 57b is moved upward, and is held by the pawl 59. Then, the mounting head 56 reaches the suction station 55a, and again picks up the electronic part 50 by suction from the part supply shelf 3.

The mounting head 56 effects this sequential operation (that is, the holding of the electronic part 50 by suction, the positioning of the electronic part 50, the mounting of the electronic part 50 and the selection of the suction nozzle), and the electronic parts 50 are sequentially mounted on the circuit board 1, thereby forming the circuit for an electronic equipment.

However, in the above conventional automatic electronic part-mounting apparatus of the rotary head type, all the mounting heads 56 are repeatedly stopped and indexed at the same time by the turntable 63, and therefore all the mounting heads 56 effect the respective operations at the stations (the suction station, the positioning station, the mounting station, the suction nozzle selection station, etc.) at the same time during the time period when the turntable 63 is stopped. Therefore, the stop time for those stations in which the time required for the operation is short must be in agreement with the stop time for those stations in which the time required for the operation is long. As a result, in order to achieve the high-speed operation of the automatic electronic part-mounting apparatus, the indexing time must be reduced, so that the acceleration of the mounting head 56 during the indexing increases. Namely, acceleration (force), acting on the electronic part 50, held on the mounting head 56 by suction, increases, and the mounting head 56 is liable to vibrate, and the electronic part 50 is liable to be displaced. This results in a problem that it is difficult to mount the electronic part 50 in a stable manner.

In order to decrease the acceleration of the mounting heads 56, there may be proposed an arrangement in which the radius of the circular path of travel of the mounting heads 56 is reduced, and the number of the mounting heads 56 is increased so as to reduce the distance of movement of the mounting heads 56 during the indexing time. In this case, the mounting heads, as well as the drive system of the turntable 63, must be extremely reduced in size, and therefore sufficient rigidity can not be secured, so that the stable mounting of the electronic parts 50 can not be effected. And besides, because of the increased number of mounting heads, the cost is increased, and since all the mounting heads are repeatedly stopped and indexed at high speed at the same time, the drive load for the index drive 61 increases, which results in a problem that the drive source is increased in size.

In the above mounting head 56, when a desired one of the suction nozzles 57 is to be selected, the rotation of the rotary table 58, the upward movement of the precedingly-selected suction nozzle 57 and the downward projecting of the selected suction nozzle 57 must be effected. Therefore, there must be provided mechanisms for effecting these operations, respectively, and this invites a problem that the mechanisms as well as the operating timing, become complicated.

Furthermore, the index drive 61 and other portion are heated because of the high-speed operation, and a mounting base for the index drive is deformed by the heat, so that the position of the mounting heads 56 before the operation of the index drive 61 is changed. This results in a problem that it is difficult to mount the electronic parts 50 in a stable manner.

SUMMARY OF THE INVENTION

With the above problems of the conventional automatic electronic part-mounting apparatus of the rotary head type in view, it is an object of this invention to provide an automatic electronic part-mounting apparatus in which the time of stop of each mounting head at each station is set to the minimum time necessary for a corresponding operation, and an indexing time for the mounting heads is made long, thereby decreasing acceleration of the mounting heads.

Another object of the invention is to provide an automatic electronic part-mounting apparatus in which the timings of indexing of mounting heads between stations are made different, and all the mounting heads are not moved at the same time, but are moved individually, so that a drive load for the mounting heads is reduced, and is made uniform, thereby reducing the size of a drive source and also reducing vibrations.

A further object of the invention is to provide an automatic electronic part-mounting apparatus in which when selecting a desired suction nozzle, the relevant suction nozzles on a mounting head are not projected downward and moved upward, respectively, and instead these operations are effected only through rotation of a rotary table, thereby simplifying the mechanism system and the operating timing.

A still further object of the invention is to provide an automatic electronic part-mounting apparatus in which an opening-closing valve for supplying vacuum to a mounting head is mounted separately from the mounting head, so that a pipe is shortened, thereby simplifying a construction and also shortening a vacuum response time.

A further object of the invention is to provide a compact, high-performance automatic electronic part-mounting apparatus in which generated heat is removed by cooling so as to reduce the influence of the heat to a minimum, thereby effecting the stable mounting of electronic parts.

According to the present invention, there is provided an automatic electronic part-mounting apparatus comprising:

a X-Y table for positioning and holding an circuit board on which various electronic parts are to be mounted;

a plurality of movable electronic part supply shelves each for supplying the electronic parts one by one in response to an instruction;

mounting heads provided between the X-Y table and the plurality of electronic part supply shelves, each of the mounting heads effecting predetermined operations (including the suction holding of the electronic part supplied from the electronic part supply shelf, the positioning of the electronic part, the mounting of the electronic part on the circuit board, and the discharging of the defective electronic part) at stations, respectively;

a fixed cam having a cam surface at its peripheral edge portion;

a rotary member rotatable at a constant speed with respect to the fixed cam; and follower levers mounted respectively on the mounting heads, each of the follower levers being pivotally mounted on the rotary member by a cam lever through a pivot shaft, and one end of the cam lever being engaged with the cam-surface through a cam follower whereas the other end of the cam lever is slidably mounted on one end of the follower lever slidably mounted on an annular rail;

wherein the cam levers as well as the follower levers and the mounting heads are circumferentially spaced at predetermined intervals; and wherein the cam surface is so formed that the mounting head can be stopped for a predetermined period of time at each of the stations.

The mounting head comprises a plurality of suction nozzles radially mounted on a conical surface of a rotary table for holding the electronic part by suction, and a slidably movable pipe for supplying vacuum from a vacuum pump to the suction nozzles, an axis of rotation of the rotary table being inclined at such an angle that a selected one of the suction nozzles can be positioned perpendicularly to the surface of the circuit board positioned by the X-Y table, and the vacuum being supplied through the pipe to the selected suction nozzle so that the selected suction nozzle can hold the electronic part by suction.

The vacuum pump is connected to a selected one of the suction nozzles through an opening-closing valve, and the opening-closing valve is provided in the vicinity of the mounting heads, and is rotated at a constant speed in concentric relation to a circle of the mounting heads by a drive source other than a drive source for driving the mounting heads, and the opening-closing valve is selectively opened and closed to enable the selected suction nozzle to hold the electronic part by suction.

Cooling means is provided on a drive portion for the mounting heads.

With this construction, the time of stop of each mounting head at each station is set to the minimum time necessary for the corresponding operation, thereby reducing the acceleration of the mounting heads. The timings of indexing of the mounting heads between the stations are made different, and all the mounting heads are not moved at the same time, but are moved individually, so that the drive load for the mounting heads is reduced, and is made uniform, thereby reducing the size of the drive source and also reducing vibrations.

When selecting the desired suction nozzle, the relevant suction nozzles on the mounting head are not projected downward and moved upward, respectively, and instead these operations are effected only through rotation of the rotary table, thereby simplifying the mechanism system of the mounting head.

The opening-closing valve for supplying vacuum to the mounting head is mounted separately from the mounting head, so that the pipe is shortened, thereby simplifying the construction and also shortening the vacuum response time.

The heat, generated in the mounting head drive portion, is removed by cooling so as to reduce the influence of the heat to a minimum, thereby effecting the stable mounting of the electronic parts.

BRIEF DESCRIPTION OF THE DRAWINGS

FIG. 9A is a front-elevational view of the mounting head;

FIG. 9B is a side-elevational view of the mounting head;

DESCRIPTION OF THE PREFERRED EMBODIMENT

A preferred embodiment of the present invention will, now be described in detail with reference to the accompanying drawings.

A general construction of an automatic electronic part-mounting apparatus of the invention will first be described with reference to FIG. 1.

Figure 1:
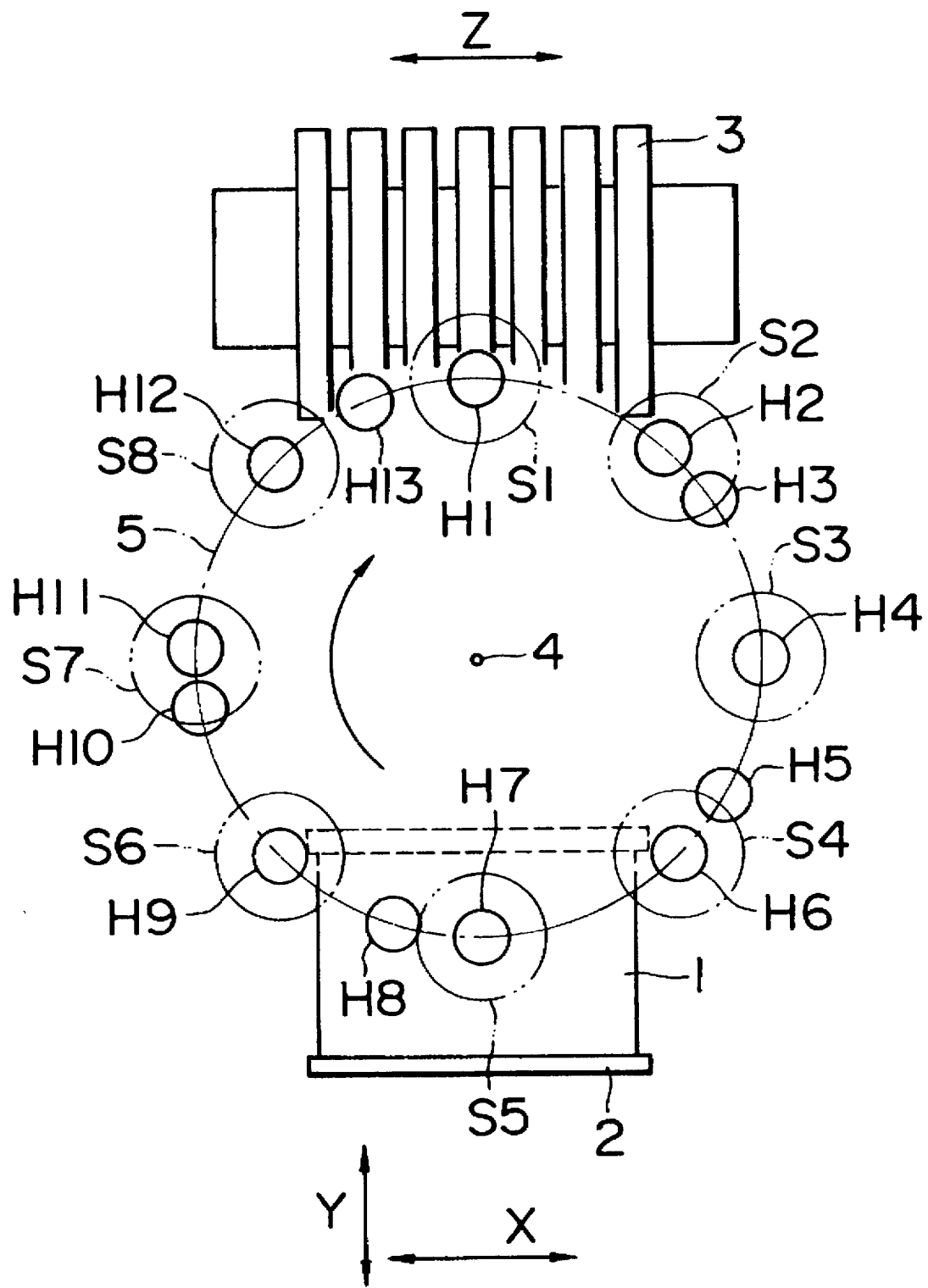
FIG. 1 is a plan view schematically showing a preferred embodiment of an automatic electronic part-mounting apparatus of the invention.

In FIG. 1, reference numeral 2 denotes an X-Y table 2 which positions a circuit board 1 (on which electronic parts 50 (see FIG. 2) are to be mounted), and is movable in directions X and Y. Reference numeral 3 denotes a plurality of electronic part supply shelves each of which is movable in a direction Z, and supplies the electronic parts 50 (packaged in the form of a tape) one by one in response to an instruction. A plurality of mounting heads H1 to H13 are arranged between the X-Y table 2 and the electronic part supply shelves 3, and each of the mounting heads H1 to H13 effects predetermined operations respectively at stations S1 to S8. In this embodiment, the number of the mounting heads is 13, and the number of the stations is 8, and the mounting heads H1 to H13 are rotated or revolved about a rotation axis 4 in a clockwise direction, and the stations S1 to S8 are arranged in a circular path 5 of travel of the mounting heads.

The mounting head H1 is stopped at the suction station S1 for a predetermined time period, and holds (or pick up) the electronic part 50 by suction which is supplied one at a time from the electronic part supply shelf 3.

The mounting head H1, after thus stopping for the predetermined time period to pick up the electronic part 50 by suction, is rotated or moved to the mounting direction selection station S2, and is stopped there for a predetermined time period so as to select the direction of mounting of the electronic part 50.

The mounting head H1, after thus stopping for the predetermined time period to select the mounting direction of the electronic part 50, is rotated to the positioning station S3, and is stopped there for a predetermined time period so as to examine the posture of the electronic part 50 held by suction.

The mounting head H1, after thus stopping for the predetermined time period to examine the posture of the suction-held electronic part 50, is rotated to the positioning correction station S4, and is stopped there for a predetermined time period so as to correct the posture of the suction-held electronic part 50.

The mounting head H1, after thus stopping for the predetermined time period to correct the posture of the suction-held electronic part 50, is rotated to the mounting station S5, and is stopped there for a predetermined period of time so as to mount the electronic part 50 on the circuit board 1 positioned by the X-Y table 2.

The mounting head H1, after thus stopping for the predetermined time period to mount the electronic part 50 on the circuit board 1, is further rotated, and is stopped sequentially at the stations S6, S7 and S8 for a predetermined time period to effect predetermined operations, and then again reaches the suction station S1. The other mounting heads H2 to H13 effect similar operations as effected by the mounting head H1.

Each of the mounting heads H1 to H13 is repeatedly stopped and rotated (or moved), and more specifically is stopped at each of the stations S1 to S8 for the predetermined time period to effect the predetermined operation, so that the electronic parts 50 are sequentially mounted on the circuit board 1. The stopping duration of each of the mounting heads H1 to H13 at each station for effecting the corresponding operation is set to the minimum time necessary for the corresponding operation.

Details of the construction of the above apparatus will be described with reference to FIGS. 2 and 3.

The apparatus comprises an outer housing 6 of an annular shape, a fixed cam 7 which is mounted within the annular housing 6, and has a corrugated cam surface formed at its peripheral edge, a ring-shaped rotary member 8 mounted within the annular housing 6 in concentric relation to the fixed cam 7, cam levers 10 each mounted on the rotary member 8 through a pivot shaft 9, follower levers 12 which are slidably mounted on annular rails 11a and 11b, and are slidably engaged with the cam levers 10, respectively, mounting heads 13 mounted respectively on the follower levers 12, a fixed cylindrical rib cam 14 for vertically moving the mounting heads 13, a speed reducer 15, a turntable 18 fixedly mounted on an output shaft 16 of the speed reducer 15, and an opening-closing valve 17 (which constitutes an air supply portion for supplying the air to the mounting heads 13) provided on the turntable 18.

An inlet port 20 and an outlet port 21 for oil (cooling means) are provided respectively at upper and lower sides of a roller gear cam 19 which drives the rotary member 8, and the oil is circulated by an oil pump (not shown) with an oil cooler.

The X-Y table 2 for positioning the circuit board 1, and the part supply shelves 3 are provided.

A plurality of roller followers 22 are arranged at equal intervals at an outer peripheral edge portion of the rotary member 8, and the rotary member 8 is supported in the vertical direction by these roller followers 22 and the fixed cam 7. The roller followers 22 are engaged with the roller gear cam 19, and the roller gear cam 19 is driven by a motor (not shown) to rotate the rotary member 8 at a constant speed.

The plurality of cam levers 10 are circumferentially arranged at equal intervals on the rotary member 8 through the respective pivot shafts 9, and in this embodiment the number of the cam levers 10 is 13.

Figure 4:
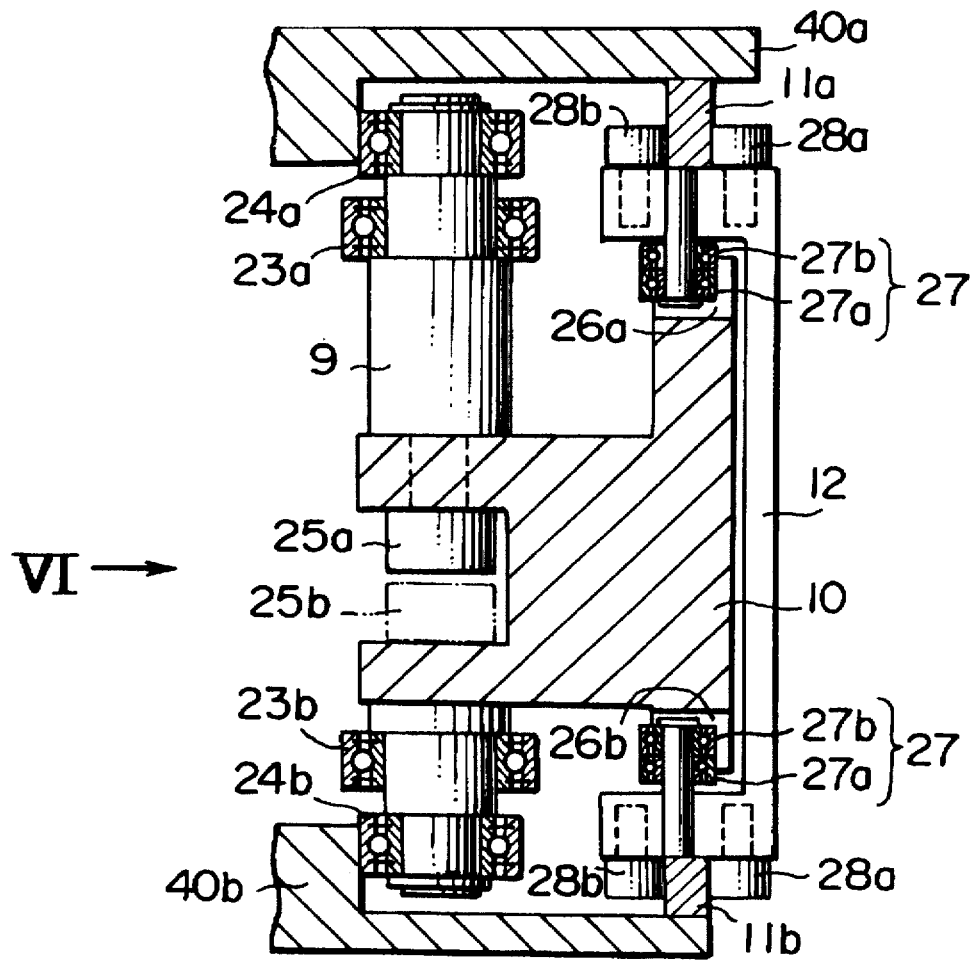
FIG. 4 is a cross-sectional view of an important portion, showing those portions of a follower lever and a cam lever engaged with each other.
Figure 5A:
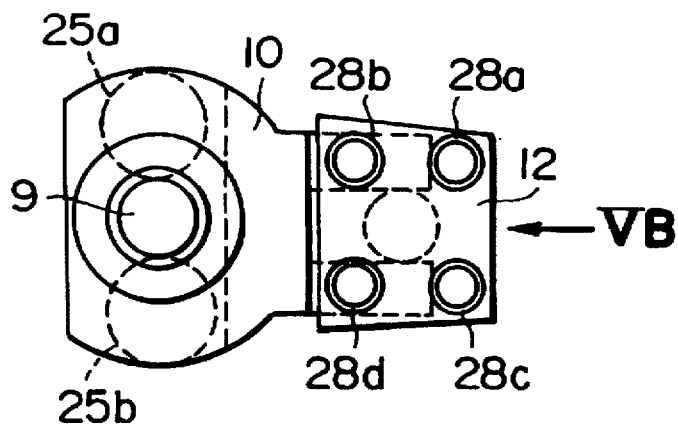
FIGS. 5A is a plan view showing the portions of the follower lever and the cam lever engaged with each other.

The constructions of the cam lever 10 and the follower lever 12 will be described with reference to FIGS. 4 and 5.

The cam levers 10 are arranged circumferentially at equal intervals on the rotary member 8, and each of the cam levers 10 is rotatably supported by upper and lower bearings 23a and 23b, and bearings 24a and 24b are provided respectively at the upper side of the bearing 23a and the lower side of the bearing 23b in coaxial relation thereto, and are held in rolling contact with housings 40a and 40b, thereby holding the rotary member 8 in the radial direction.

Figure 5B:
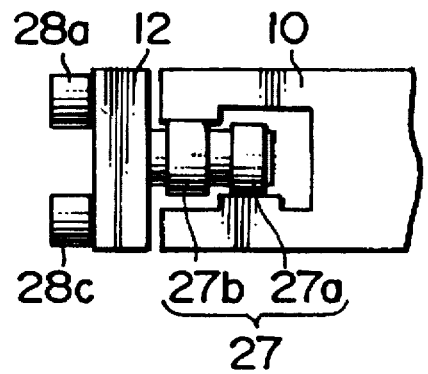
FIG. 5B is a view as seen from a direction of arrow VB of FIG. 5A.

A pair of upper and lower cam followers 25a and 25b are mounted at one end of the cam lever 10, and a pair of upper and lower U-shaped grooves 26a and 26b are formed at the other end of the cam lever 10, thereby forming portions of engagement with the follower lever 12. Two pairs of roller followers 27a and 27b are provided respectively at upper and lower end portions of the follower lever 12, and are engaged respectively in the upper and lower U-shaped grooves 26a and 26b in the cam lever 10. In order to prevent the shaking of the cam lever 10 with respect to the follower lever 12 so as to achieve the smooth sliding movement, the U-shaped groove 26a, 26b is so formed as to closely receive the roller followers 27a and 27b as shown in FIG. 5B.

Four cam followers 28a, 28b, 28c and 28d are provided at each of the upper and lower end surfaces of the follower lever 12, and the four cam followers 28a to 28d at the upper end surface are slidably engaged with the annular rail 11a whereas the four cam followers 28a to 28d at the lower end surface of the follower lever 12 are slidably engaged with the annular rail 11b, so that the follower lever 12 can make a circular motion.

The constructions of the mounting head 13, the fixed cylindrical rib cam 14 and the opening-closing valve 17 for supplying the air will be described with reference to FIGS. 2 and 3.

Roller followers 30a and 30b are provided at the inner end surface of the mounting head 13 in such a manner that a rib portion of the fixed cylindrical cam 14 is held between the roller followers 30a and 30b.

Sliders 32a and 32b are provided at the mounting station S5 and the suction station S1, respectively, and are slidingly moved upward and downward by plate cams 31a and 31b, respectively. At the mounting station S5, the mounting head 13 is moved downward to mount the electronic part 50 on the circuit board 1, and at the suction station S1, the mounting head 13 is moved downward to hold the electronic part 50 by suction.

Figure 10A:
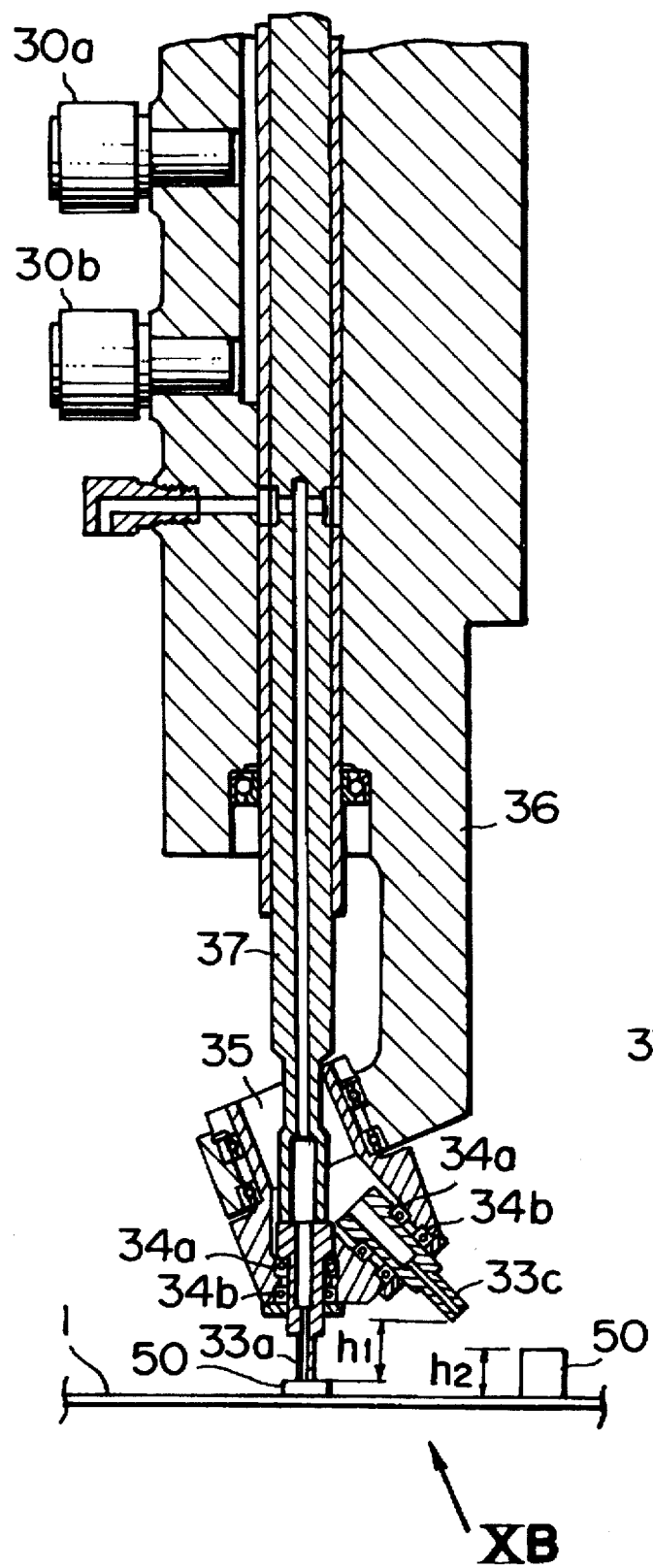
FIG. 10A is a cross-sectional view showing the mounting head.
Figure 10B:
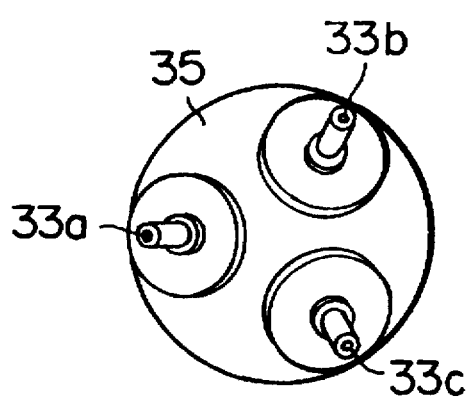
FIG. 10B is a view as seen from a direction of arrow XB of FIG. 10A.
Figure 11:
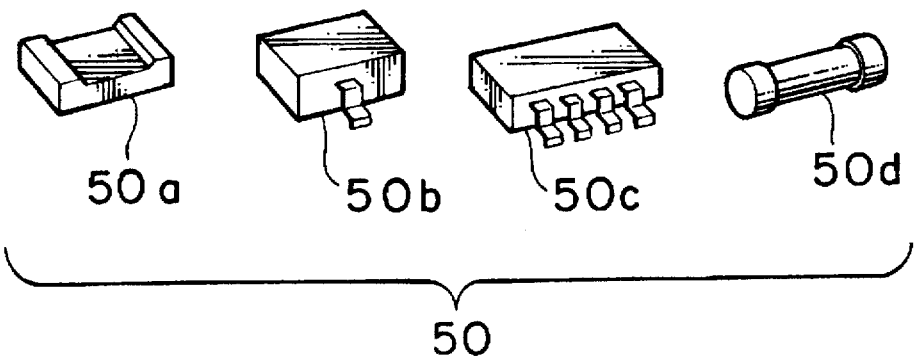
FIG. 11 is a perspective view showing various conventional electronic parts.
Figure 12:
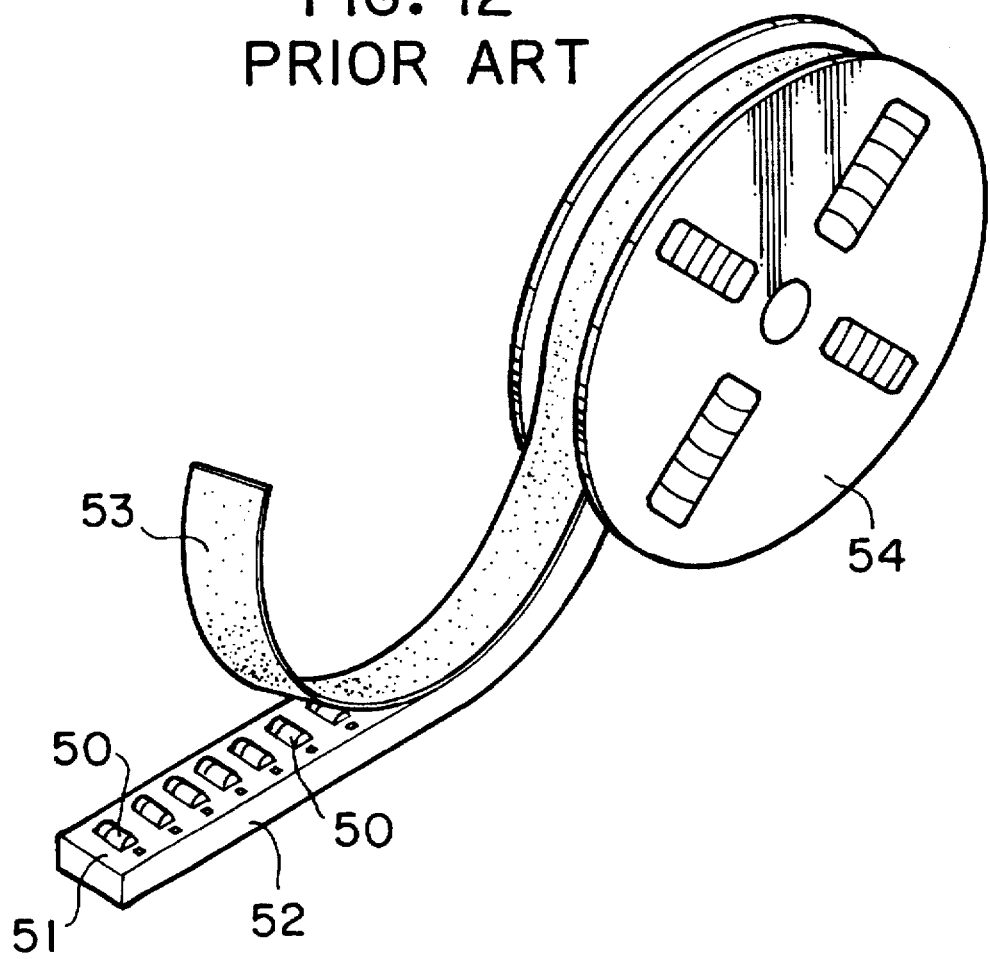
FIG. 12 is a perspective view showing the conventional manner of supply of the electronic parts.
Figure 13:
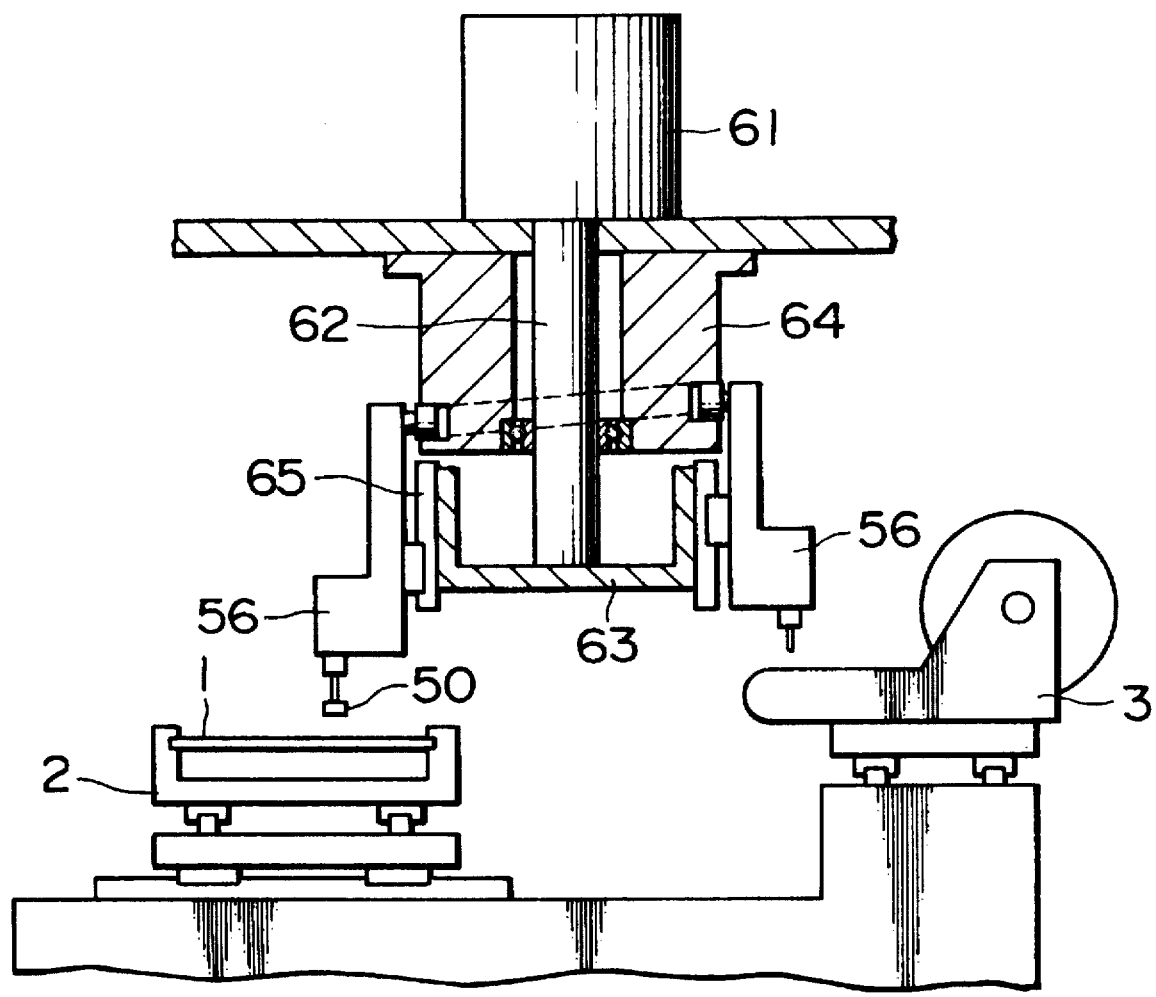
FIG. 13 is a cross-sectional view of a conventional automatic electronic part-mounting apparatus.
Figure 14:
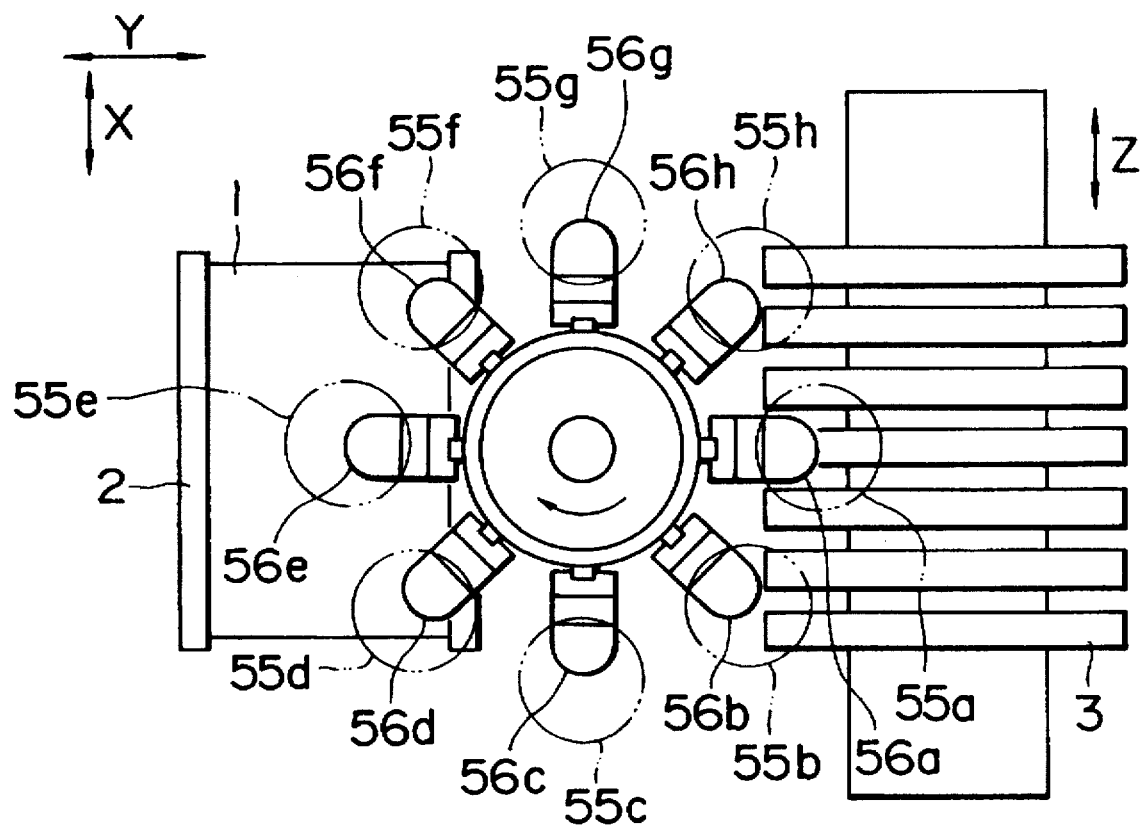
FIG. 14 is a plan view of the apparatus of FIG. 13.
Figure 15:
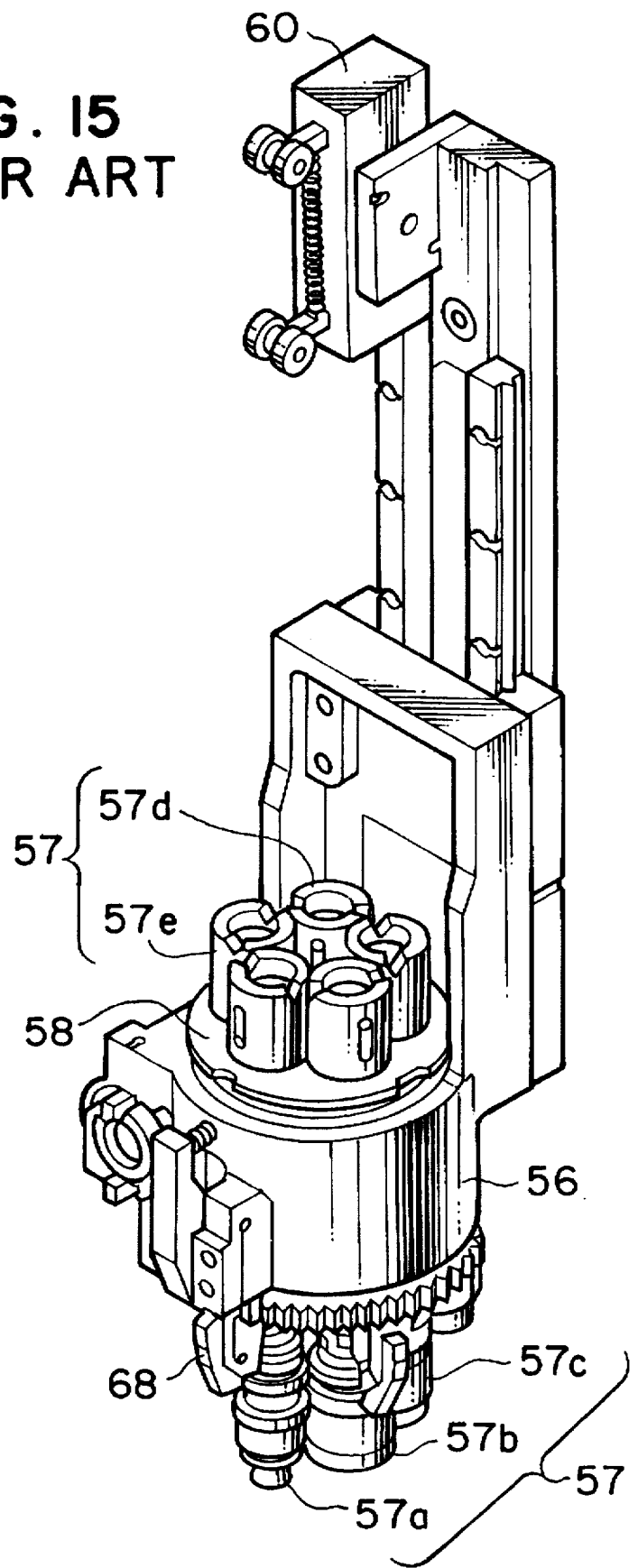
FIG. 15 is a perspective view of a mounting head in the apparatus of FIG. 13.
Figure 16:
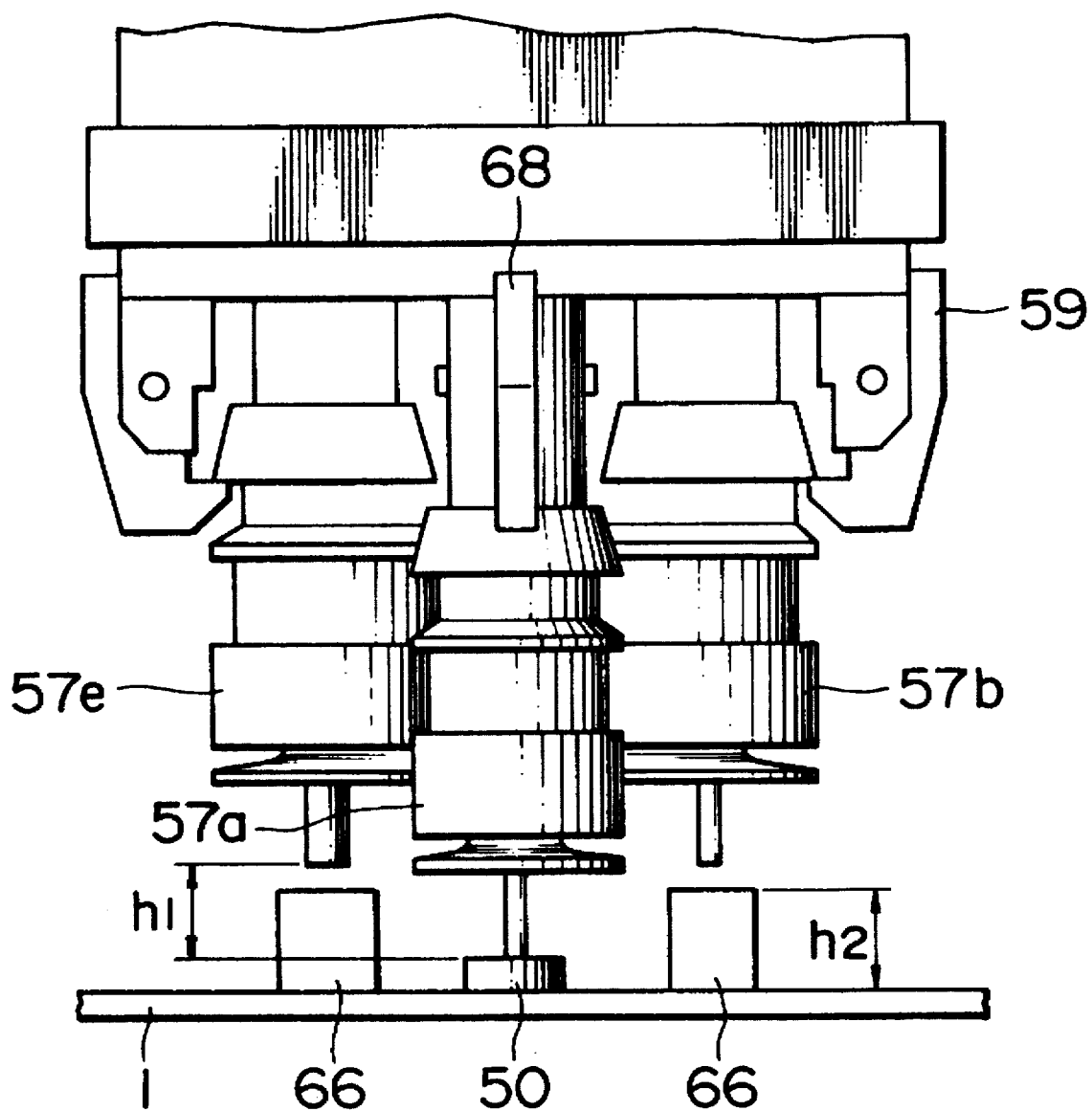
FIG. 16 is an enlarged view of an important portion of the conventional mounting head.
Figure 17:
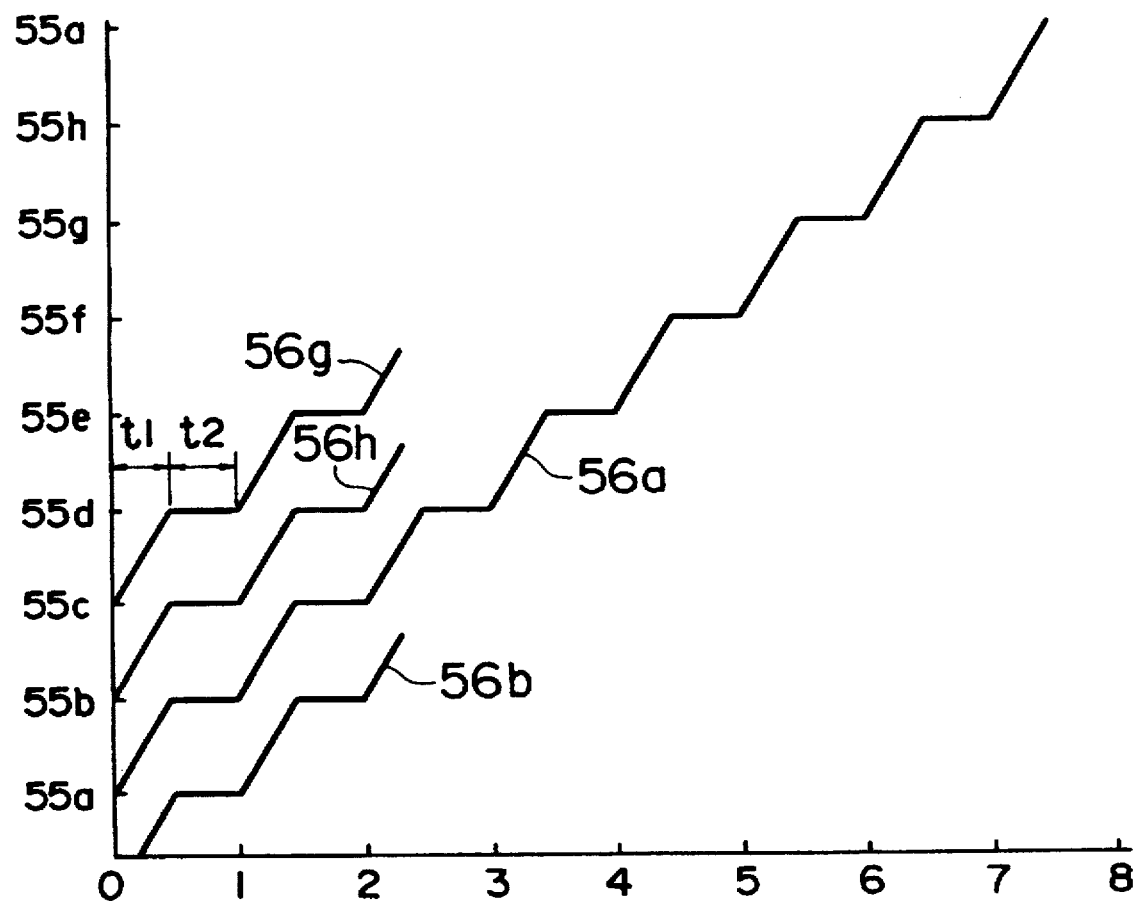
FIG. 17 is a diagram showing the operation of the conventional mounting heads.

The construction of the mounting head will be described with reference to FIGS. 9 and 10.

Suction nozzles 33a to 33c are rotatably supported by bearings 34a and 34b, and are arranged radially on a conical surface of a rotary table 35. The rotary table 35 is supported on a frame 36 of the mounting head at such an angle that the selected suction nozzle 33a, holding the electronic part 50 by suction, can be disposed perpendicular to the circuit board 1. With this arrangement, there is a height difference between the selected nozzle 33a and the other nozzles 33b and 33c, and this height difference h1 is larger than a height h2 of the electronic part 50 on the circuit board 1 (h1>h2) so that when mounting the electronic part 50 by the selected nozzle 33a, the nozzles 33b and 33c will not interfere with the electronic part 50 on the circuit board 1.

A hollow pipe 37, engaged with the suction nozzle 33a for supplying the air to the suction nozzle 33a, is supported for being slidingly moved upward and downward by a drive means (not shown).

Figure 2:
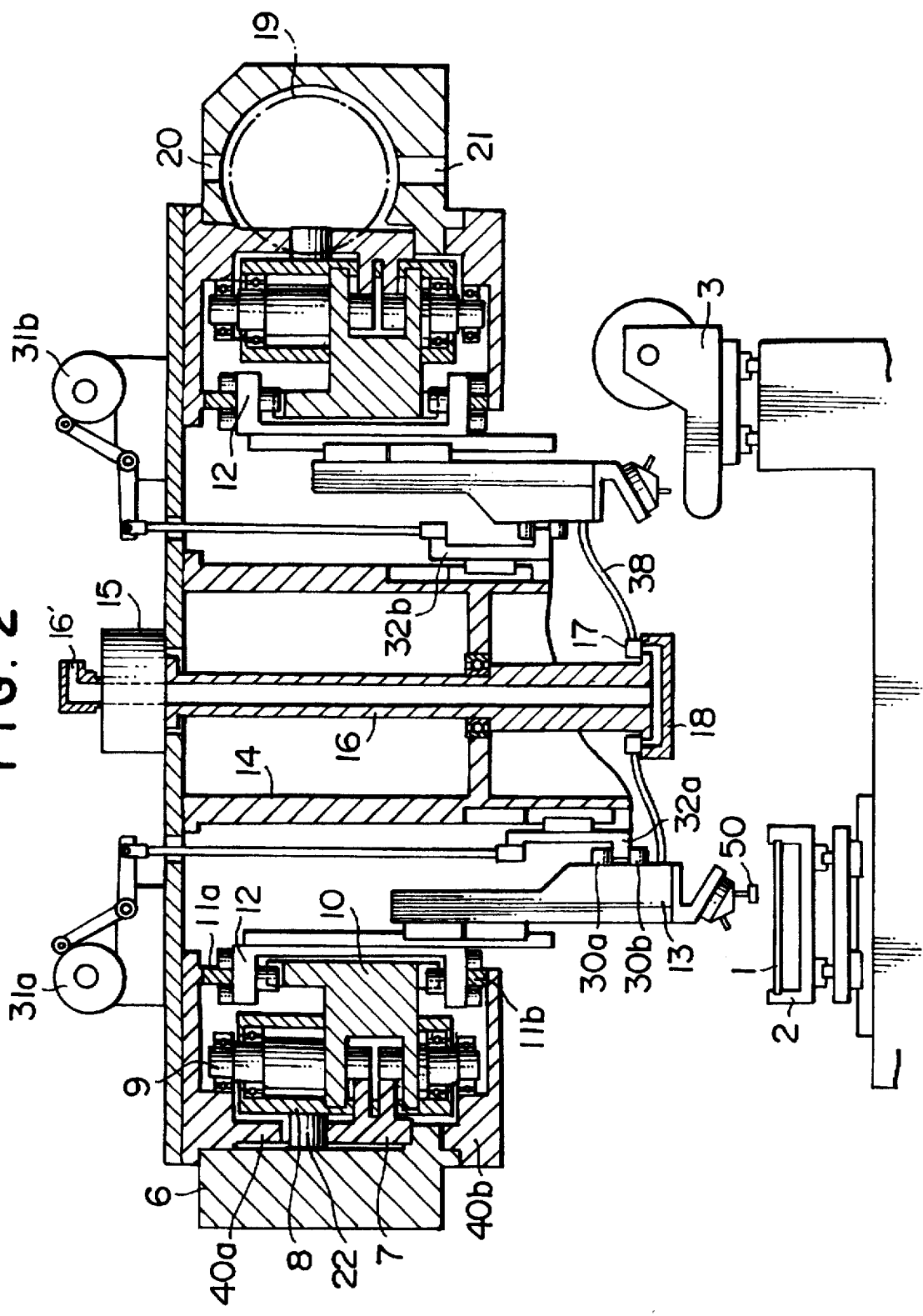
FIG. 2 is a vertical cross-sectional view thereof.
Figure 3:
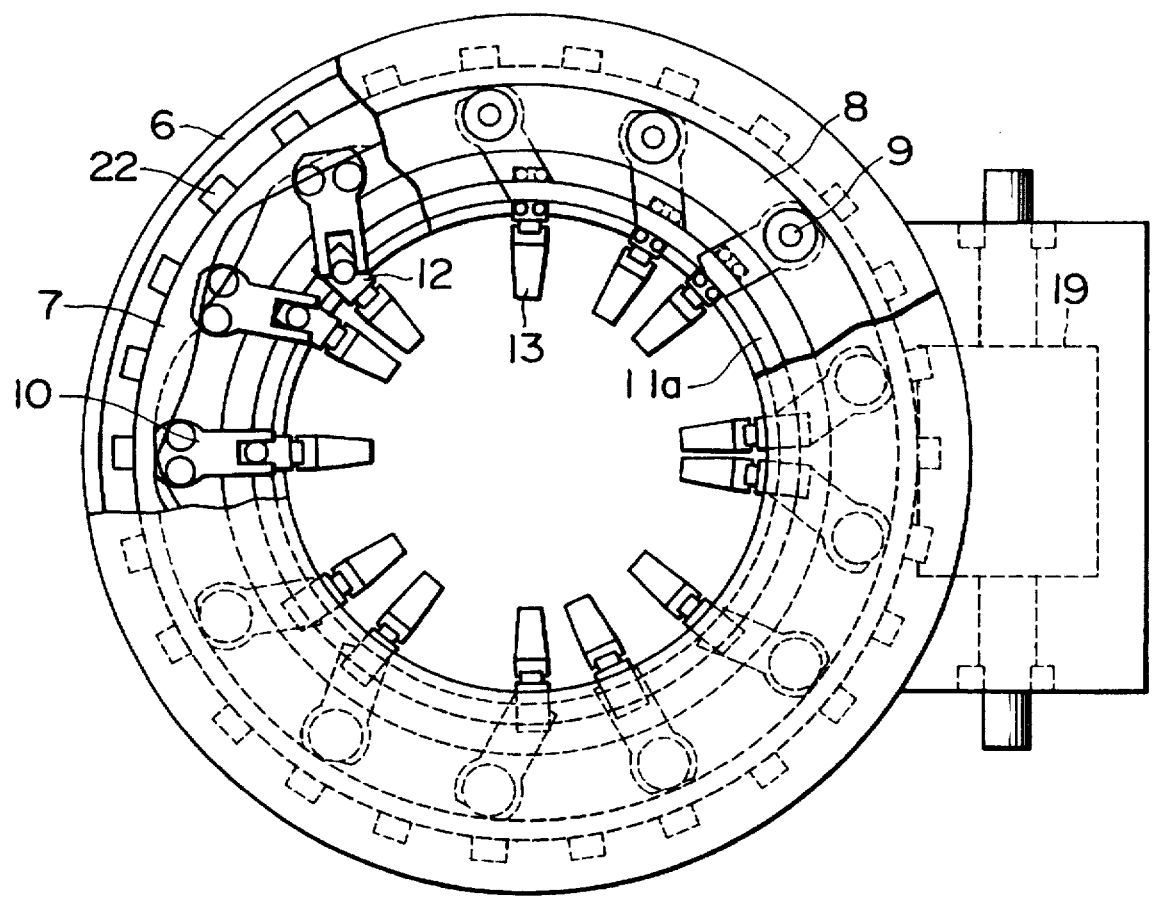
FIG. 3 a partly-broken, plan view of the apparatus.

The air is supplied to the pipe 37 through a tube 38 connected to the opening-closing valve 17 (see FIG. 2).

A gear 39 is formed on an outer peripheral surface of the rotary table 35, and a desired one of the suction nozzles 33a to 33c is selected by rotating the rotary table 35 through the gear 39 meshingly engaged with a gear (not shown). At this time, the pipe 37, engaged with the suction nozzle 33a, is moved upward and downward by the drive means (not shown).

A vacuum supply construction will be described with reference to FIG. 2. The speed reducer 15 is disposed on the axis of rotation of the mounting heads 13, and the speed reducer 15 is driven by the roller gear cam 19 to rotate the turntable 18 (which has the opening-closing valve 17 formed on the output shaft 16) at a constant speed. The opening-closing valve 17 can be opened and closed at the predetermined stations.

The opening-closing valve 17 for the mounting heads 13 is provided, and the short tubes 38 are provided, and with this construction, a vacuum response time is shortened.

The output shaft 16 of the speed reducer 15 is of a hollow construction, and the vacuum is supplied from an upper end 16' of the output shaft 16.

Figure 6:
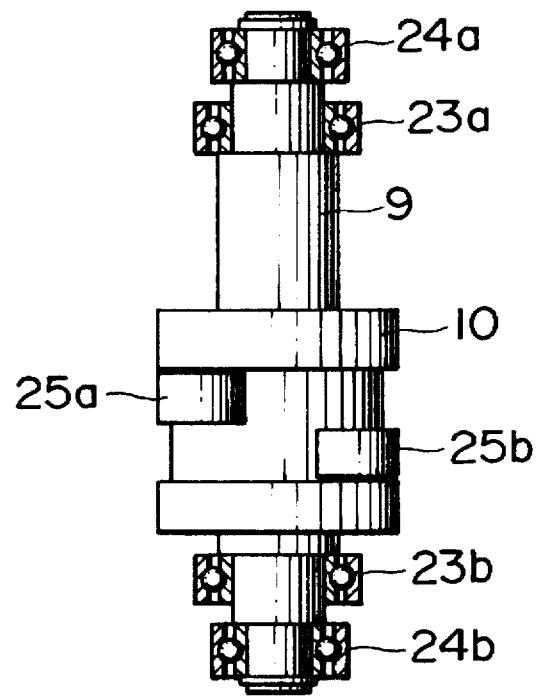
FIG. 6 is a view showing the cam lever.

The constructions of the cam lever 10 and the fixed cam 7 will be described with reference to FIGS. 6 and 7. FIG. 6 is a view of the cam lever 10 as seen from a direction VI of FIG. 4. The cam followers 25a and 25b are disposed at different levels (heights), respectively, and the fixed cam 7 has an upper fixed cam 7a engaged with the cam follower 25a, and a lower fixed cam 7b engaged with the cam follower 25b. By forming the fixed cam 7 into a suitable configuration, the cam lever 10 can make an arcuate motion (that is, a pivotal movement) about the roller followers 27 so that the mounting head 13 can be stopped.

A backlash of the cam lever 10 is suppressed by the use of the two fixed cams 7a and 7b.

In the above automatic electronic part-mounting apparatus of this embodiment, when the roller gear cam 19 is driven, the rotary member 8 is rotated at a constant speed through the plurality of roller followers 22 provided at the outer peripheral edge portion of the rotary member 8. In FIG. 7, the cam lever 10 rotates in accordance with the rotation of the rotary member 8, and when the cam lever 10 reaches a recessed portion of the fixed cam 7, the cam lever 10 makes an arcuate motion about the roller followers 27, so that the predetermined stop time is obtained. Therefore, the follower lever 12, engaged with the roller followers 27, is stopped for the predetermined time period, and hence the associated mounting head 13 is also stopped for the predetermined time period. Then, in accordance with the rotation of the rotary member 8, the roller followers 27 gradually move, and in accordance with this movement, the follower lever 12 moves through the cam followers 28a to 28d while guided by the annular rails 11a and 11b.

Figure 8:
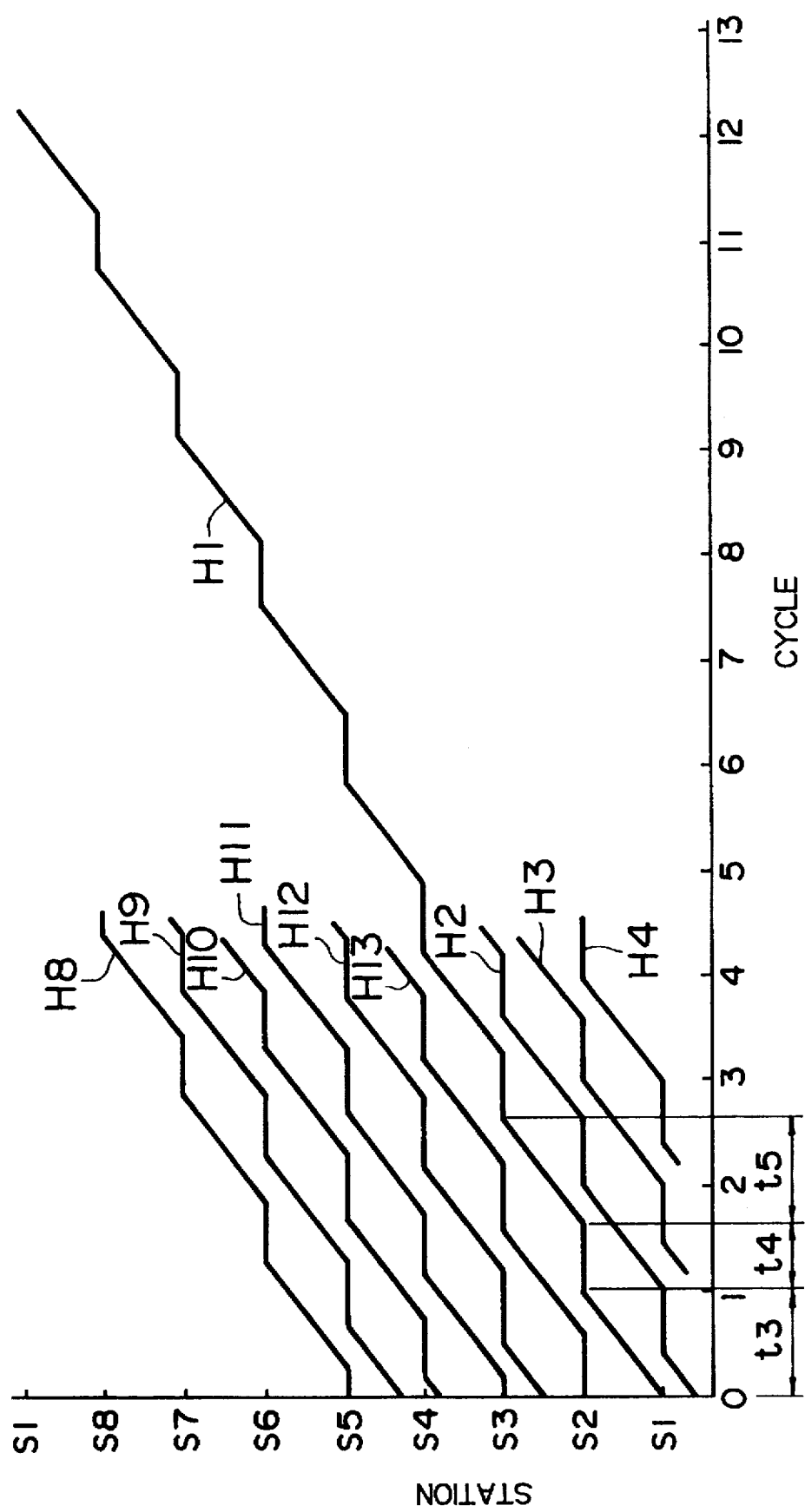
FIG. 8 is a diagram showing the operation of mounting heads.

The operation of the mounting heads H1 to H13 in this embodiment will be described with reference to FIG. 8. In this embodiment, the number of the mounting heads is 13, and the number of the stations is 8. In FIG. 8, the abscissa axis represents the rotational angle of the rotary member 8, and therefore 0 degree and 360 degrees are the same position. The stations are represented respectively by S1 to S8 (S1=0°, S2=45°, S3=90°, ... ), and in this embodiment the eight stations are angularly spaced 45° from one another. S1 denotes the suction station, S3 the positioning station, S5 the mounting station, and S7 the suction nozzle selection station. The ordinate axis represents the number of rotation of the roller gear cam 19, and one cycle is a tack time of the automatic electronic part-mounting apparatus, and H1 to H13 denote the mounting heads, respectively.

When the roller gear cam 19 begins to rotate, the mounting head H1 begins to move toward the station S2, and after a time t3, the mounting head H1 starts stopping at the station S2.

Figure 7:
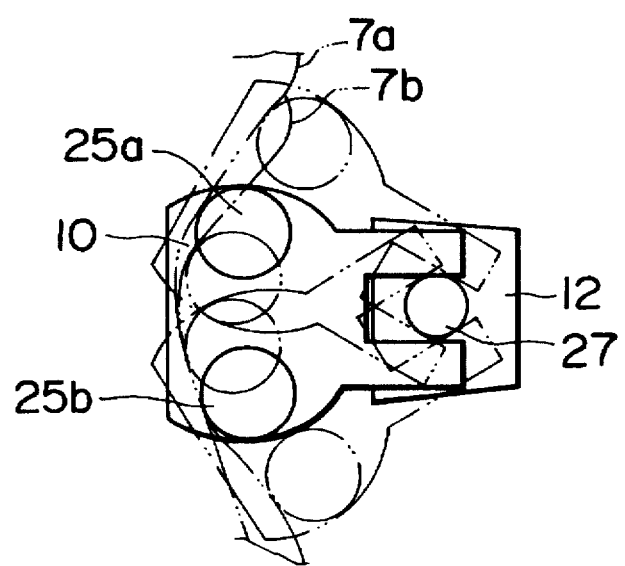
FIG. 7 is a view showing the operation of the follower lever and the cam lever.

The mounting head H1 is kept stopped for a time period t4 at the station S2 (this condition is shown in FIG. 7), and then the mounting head H1 begins to move toward the station S3, and after a time t5, the mounting head H1 starts stopping at the station S3.

Thus, the mounting head H1 is repeatedly stopped and moved, and again reaches the station S1 via the stations S4 to S8. The step time t4 at the stations, and the movement times t3 and t5 can be freely determined by the configuration of the fixed cam 7.

The roller gear 19 makes one revolution, and during the time when the mounting head H1 is moving toward the station S2, the mounting head H2 starts stopping at the station S1. Then, the mounting head H2 is repeatedly stopped and moved at the stations S1 to S8 as described for the mounting head H1.

The number of the mounting heads H1 to H3, the number of the stations, the arrangement of the stations, and the configuration of the fixed cam 7 are so determined that the timings, at which the mounting heads H1 to H13 respectively start to move at the stations S1 to S8, are different.

The number of the mounting heads is larger than the number of the stations, and with this construction the stop-movement (t3+t4), does not need to be within one cycle (tack time), and the stop time of the mounting heads or the movement time thereof can be made long (this suppresses the acceleration).

Therefore, in the automatic electronic part-mounting apparatus of this embodiment, by suitably determining the configuration of the fixed cam 7, the mounting heads H1 to H13 can be repeatedly stopped and moved with respect to the rotary member 8 rotating at the constant speed.

By the configuration of the fixed cam 7, the stopping duration of each of the mounting heads H1 to H13 at each station is set to the minimum time necessary for the corresponding operation. Namely, the time of stop of each mounting head at each of the stations S1 to S8 can be determined individually.

The timings, at which the mounting heads H1 to H13 respectively start to move at the stations S1 to S8, are different, and with this arrangement the torque load, produced during the rotation of the roller gear cam 19, can be kept to a minimum, and the drive source can be reduced in size, and the vibration of the apparatus can be reduced.

As described above, in the automatic electronic part-mounting apparatus of the invention, when the rotary member is rotated by the roller gear cam, each cam lever, having the pivotal axis on the rotary member, is pivotally moved by the fixed cam, and the mounting head is repeatedly stopped at the stations and moved through the follower lever engaged with the cam lever. When the mounting head is stopped at the stations, the mounting head effects the predetermined operations, including the suction-holding of the electronic part, the positioning of the electronic part and the mounting of the electronic part, and thus the electronic parts are mounted on the circuit board.

In the conventional automatic electronic part-mounting apparatus, the stop time for the mounting heads is determined in accordance with the station in which the time required for the operation is the longest, and therefore in order to achieve the high-speed operation of the apparatus, the movement time for the mounting heads is shortened, so that the acceleration of the mounting heads increases. In the present invention, however, the stopping duration of each mounting head at each of the stations can be determined individually by the configuration of the fixed cam, and therefore the stopping duration of the mounting head at each station can be individually set to the minimum time, and hence the movement time can be made long, and therefore the acceleration of the mounting heads can be decreased 70% as compared with the conventional apparatus. By increasing the number of the mounting heads with respect to the number of the stations, the time of movement of the mounting head between the stations can be made long, so that the acceleration of the mounting heads can be further decreased.

The timings, at which the mounting heads respectively start to move at the stations, are different, and with this arrangement the torque load, produced during the rotation of the roller gear cam, can be kept to a minimum, and the drive source can be reduced in size, and the vibration of the apparatus can be reduced.

The mounting heads are arranged inwardly of the plate cam, and with this construction the size of the apparatus can be reduced, and besides the force acting on the cam lever can be reduced, thereby ensuring the sufficient rigidity. Furthermore, the influence of the working precision of the plate cam on the mounting head can be reduced.

The suction nozzles of the mounting head are arranged on the conical surface, and with this arrangement the desired suction nozzle can be selected merely by rotation of the rotary table, thereby simplifying the mechanism system.

The opening-closing valve for supplying the air is provided in the vicinity of the mounting heads, and with this construction the piping, connected to the mounting head, can be simplified, thereby reducing the response time.

The drive system is provided with a cooling means, and therefore thermal deformation of the drive system-constituting parts can be suppressed to a minimum, thereby achieving stable operation.

What is claimed is:

1. An automatic electronic part-mounting apparatus comprising:

a X-Y table for positioning and holding a circuit board on which various electronic parts are to be mounted;

a plurality of movable electronic part supply shelves each for supplying the electronic parts one by one in response to an instruction;

mounting heads provided between said X-Y table and said plurality of electronic part supply shelves, each of said mounting heads effecting predetermined operations, including suction holding of the electronic part supplied from said electronic part supply shelf, positioning of the electronic part, mounting of the electronic part on said circuit board, and discharging of the defective electronic part, at stations, respectively;

a liked cam having a cam surface at its peripheral edge portion;

a rotary member rotatable at a constant speed with respect to said fixed cam; and follower levers mounted respectively on said mounting heads, each of said follower levers being pivotally mounted on said rotary member by a cam lever through a pivot shaft, and one end of said cam lever being engaged with said cam surface through a cam follower whereas the other end of said cam lever is slidably mounted on one end of said follower lever which is slidably mounted on an annular rail;

wherein said cam levers as well as said follower levers and said mounting heads are circumferentially spaced at predetermined intervals; and wherein said cam surface is so formed that each of said mounting head can be stopped for a predetermined period of time at each of said stations.

2. Apparatus according to claim 1, in which each of said mounting heads comprises a plurality of suction nozzles radially mounted on a conical surface of a rotary table for holding the electronic part by suction, and a slidably movable pipe for supplying vacuum from a vacuum pump to said suction nozzles, an axis of rotation of said rotary table being inclined at such an angle that a selected one of said suction nozzles can be positioned perpendicularly to the surface of said circuit board positioned by said X-Y table, and the vacuum being supplied through said pipe to said selected suction nozzle so that said selected suction nozzle can hold the electronic part by suction.

3. Apparatus according to claim 2, in which said vacuum pump is connected to a selected one of said suction nozzles through an opening-closing valve, and said opening-closing valve is provided in the vicinity of said mounting heads, and is rotated at a constant speed in concentric relation to a circle of said mounting heads by a drive source other than a drive source for driving said mounting heads, and said opening-closing valve is selectively opened and closed to enable said selected suction nozzle to hold the electronic part by suction.

4. Apparatus according to claim 1, in which cooling means is provided on a drive portion for said mounting heads.

* * * * *